(12) United States Patent
Lim et al.

(10) Patent No.: US 9,627,452 B2
(45) Date of Patent: Apr. 18, 2017

(54) ORGANIC LIGHT EMITTING DISPLAY APPARATUS

(71) Applicant: Samsung Display Co., Ltd., Yongin (KR)

(72) Inventors: Jaeik Lim, Yongin (KR); Jinwoo Choi, Yongin (KR); Haeyun Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/725,534

(22) Filed: May 29, 2015

(65) Prior Publication Data

US 2016/0035795 A1 Feb. 4, 2016

(30) Foreign Application Priority Data

Jul. 30, 2014 (KR) .................. 10-2014-0097618

(51) Int. Cl.
*H01L 27/32* (2006.01)
*H01L 51/52* (2006.01)

(52) U.S. Cl.
CPC ........ *H01L 27/322* (2013.01); *H01L 51/5284* (2013.01); *H01L 27/3244* (2013.01)

(58) Field of Classification Search
CPC ............... H01L 27/322; H01L 51/5284; H01L 27/3246; H01L 51/5012
See application file for complete search history.

(56) References Cited

U.S. PATENT DOCUMENTS

| | | | |
|---|---|---|---|
| 6,445,005 B1 * | 9/2002 | Yamazaki | H01L 27/322 257/59 |
| 7,339,315 B2 | 3/2008 | Suh et al. | |
| 7,541,734 B2 * | 6/2009 | Yamazaki | H01L 27/3211 313/483 |
| 8,710,501 B2 * | 4/2014 | Miyazawa | H01L 27/322 257/59 |
| 2007/0002225 A1 | 1/2007 | Baek | |
| 2010/0231485 A1 | 9/2010 | Cok et al. | |
| 2014/0190621 A1 * | 7/2014 | Kawata | B32B 38/10 156/155 |
| 2014/0191216 A1 * | 7/2014 | Matsumoto | H01L 51/5284 257/40 |
| 2015/0008417 A1 * | 1/2015 | Ochi | H01L 51/5281 257/40 |
| 2015/0048347 A1 * | 2/2015 | Tokuda | H01L 51/5284 257/40 |

(Continued)

FOREIGN PATENT DOCUMENTS

| KR | 10-2005-0029426 | 3/2005 |
|---|---|---|
| KR | 10-2007-0001649 | 1/2007 |
| KR | 10-2012-0041890 | 5/2012 |

*Primary Examiner* — William Coleman
(74) *Attorney, Agent, or Firm* — H.C. Park & Associates, PLC

(57) ABSTRACT

An organic light emitting display apparatus wherein a shift of white light caused by a viewing angle is reduced by adjusting an offset distance between one end of a corresponding emission region and one end of the black matrix adjacent to the one end of the corresponding emission region, thereby preventing a white color shift phenomenon at various viewing angles. Accordingly, a certain image is produced regardless of a use environment of a user's viewing angle.

10 Claims, 6 Drawing Sheets

(56) References Cited

U.S. PATENT DOCUMENTS

| | | | |
|---|---|---|---|
| 2015/0179725 A1* | 6/2015 | Kuji | H01L 51/5246 257/40 |
| 2015/0187857 A1* | 7/2015 | Negishi | H01L 27/322 257/40 |
| 2015/0340412 A1* | 11/2015 | Lee | H01L 27/3244 257/88 |
| 2015/0340655 A1* | 11/2015 | Lee | H01L 51/525 257/40 |
| 2016/0026037 A1* | 1/2016 | Lin | G02F 1/133514 349/96 |

* cited by examiner

ORGANIC LIGHT EMITTING DISPLAY APPARATUS

CROSS-REFERENCE TO RELATED APPLICATION

This application claims priority from and the benefit of Korean Patent Application No. 10-2014-0097618, filed on Jul. 30, 2014, which is hereby incorporated by reference for all purposes as if fully set forth herein.

BACKGROUND

Field

Exemplary embodiments relate to an organic light emitting display apparatus.

Discussion of the Background

Display apparatuses are devices that are used to provide a user with visual information, such as an image, text, or a combination thereof. Such display apparatuses are manufactured in various types for accomplishing these tasks.

One form of display, an organic light emitting display apparatus, is a self-emitting display apparatus that electrically excites an organic compound to emit light. Such organic light emitting display apparatuses have beneficial properties, such as energy savings since they are driven with a low voltage, and space savings since they can be made thin. Additional beneficial qualities of organic light emitting displays include a broad viewing angle and a fast response time. As such, this type of display is attracting attention as a next-generation display for solving drawbacks of liquid crystal display (LCD) apparatuses.

Currently, organic light emitting displays are being widely adopted for electronic devices that are ubiquitous in daily life, including mobile communication terminals, such as smart phones, digital cameras, notebook computers, monitors, televisions (TVs), etc. As the demand for electronic devices increases, the necessity for organic light emitting display apparatuses which flexibly respond to the use environments of users is increasing.

A user views an organic light emitting display apparatus at various viewing angles, and due to a change in a viewing angle, a white color shift phenomenon occurs in the organic light emitting display apparatus.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display apparatus that includes: a first substrate; a second substrate that is disposed to be opposite to the first substrate; a display unit that is disposed at a surface facing the second substrate among surfaces of the first substrate, and includes a plurality of emission regions in which a plurality of organic light emitting diodes (OLEDs) having a resonance structure are respectively disposed; a black matrix that is disposed at a surface facing the first substrate among surfaces of the second substrate, and having a plurality of light blocking elements disposed to overlap peripheral regions of corresponding emission regions; and a plurality of color filters that are disposed adjacent to the black matrix in correspondence with the plurality of emission regions. A shift of white light caused by a viewing angle is adjusted by adjusting an offset distance between one end of a corresponding emission region and one end of a light blocking element of the black matrix adjacent to the one end of the corresponding emission region.

Additional aspects will be set forth in part in the description which follows and, in part, will be apparent from the description, or may be learned by practice of the presented embodiments.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
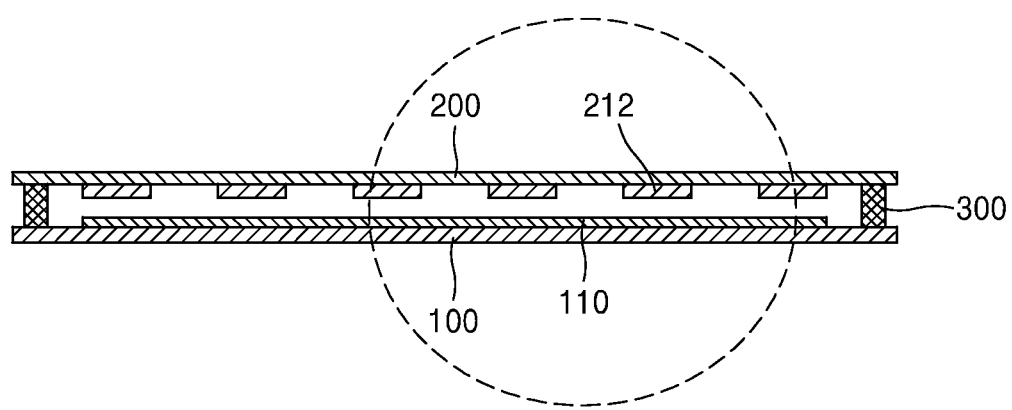
FIG. 1 is a cross-sectional view schematically illustrating an organic light emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view schematically illustrating an organic light emitting display apparatus according to an exemplary embodiment.

Referring to FIG. 1, the organic light emitting display apparatus may include a first substrate 100, a display unit 110 formed on the first substrate 100, a second substrate 200, a black matrix 212 formed on the second substrate 200, and a supporting unit 300 that supports the first substrate 100 and the second substrate 200.

The first substrate 100 may be formed of various flexible materials. For example, the first substrate 100 may include plastic having good heat resistance and durability like polyethyeleneterepthalate (PET), polyethyelenennapthalate (PEN), polycarbonate (PC), polyallylate, polyetherimide (PEI), polyethersulphone (PES), and polyimide (PI). However, the present invention is not limited thereto. In another exemplary embodiment, the first substrate 100 may be formed of various materials, such as a glass material and a metal material.

Similarly to the above-described first substrate 100, the second substrate 200 may be formed of various materials. For example, the second substrate 200 may be formed of at least one of the various materials for forming the first substrate 100.

When the display apparatus according to an exemplary embodiment of the present invention has a top emission type in which an image is implemented in a direction of the second substrate 200, the second substrate 200 may be formed of a transparent material. However, when the display apparatus according to an exemplary embodiment of the present invention has a bottom emission type in which an image is implemented in a direction of the first substrate 100, the first substrate 100 may be formed of a transparent material, but the second substrate 200 may not be formed of a transparent material.

When one of the first and second substrates 100 and 200 is not formed of a transparent material, a corresponding substrate may be formed of an opaque material, for example, an opaque metal material. When one of the first and second substrates 100 and 200 is formed of metal, a corresponding substrate may include one or more selected from the group consisting of carbon (C), iron (Fe), chromium (Cr), manganese (Mn), nickel (Ni), titanium (Ti), molybdenum (Mo), and stainless steel (SUS), but the present invention is not limited thereto. The display unit 110 is disposed at a top of the first substrate 100. The term "display unit 110" used herein is a generic name for an organic light emitting diode (OLED) and a thin film transistor (TFT) array for driving the OLED, and denotes a part displaying an image and a driving part for displaying the image.

However, the present invention is not limited thereto. That is, the display unit 110 may include various types of display devices, namely, an LCD device. For convenience of a description, in the present exemplary embodiment, an OLED will be described an example.

An encapsulating member 210 (see FIG. 2) is formed at a top of the first substrate 100 to cover the display unit 110. The OLED included in the display unit 110 is formed of an organic material, and is easily deteriorated by external moisture or oxygen. Therefore, the encapsulating member 210 is formed to protect the display unit 110. The encapsulating member 210 may be formed of an organic material or an inorganic material.

In an exemplary embodiment, the encapsulating member 210 may include one or more organic layers or one or more inorganic layers. For example, the encapsulating member 210 may have a structure in which the one or more organic layers or the one or more inorganic layers are alternately stacked at least once.

The encapsulating member 210 which protects the display unit 110 is formed, and thus, a display device is easily thinned and can be made flexible.

Figure 2:
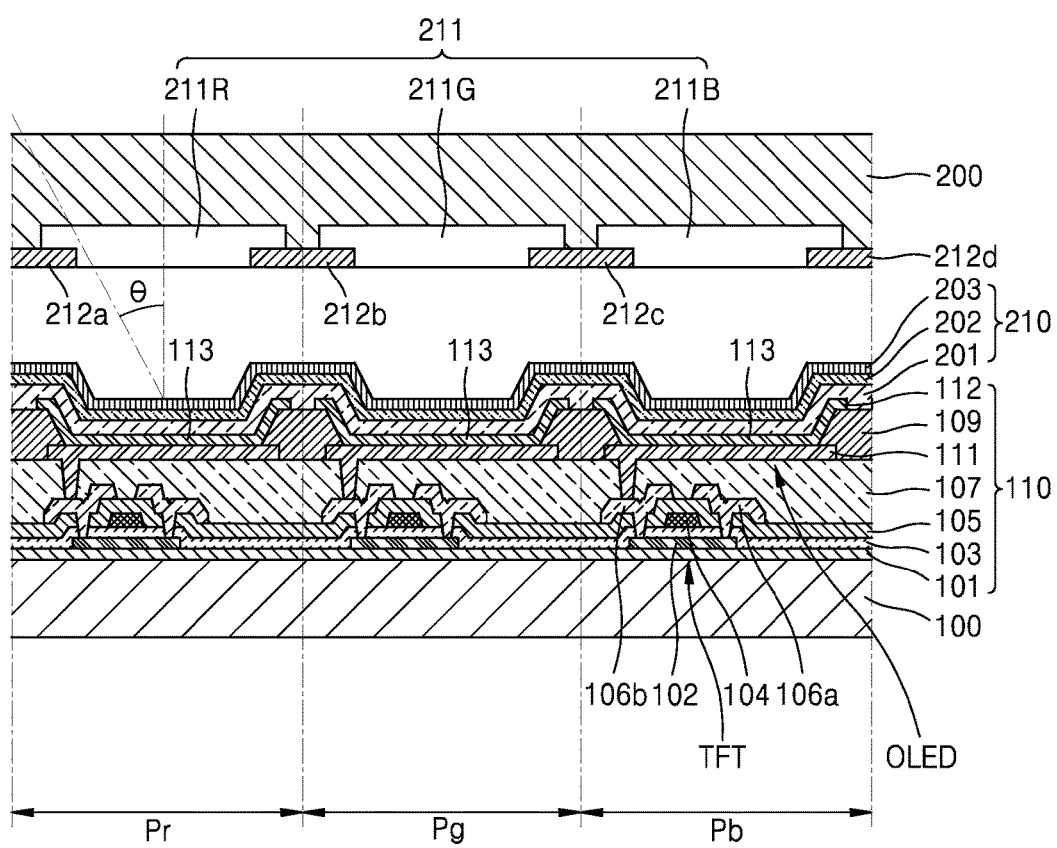
FIG. 2 is a cross-sectional view illustrating an enlarged display unit of the organic light emitting display apparatus of FIG. 1.

FIG. 2 is a cross-sectional view illustrating an enlarged display unit of the organic light emitting display apparatus of FIG. 1. FIG. 2 illustrates a detailed cross-sectional surface of the display unit 110 and a detailed cross-sectional surface of the encapsulating member 210. When seen on a plane, the display unit 110 includes a plurality of pixels which are arranged in a matrix.

A plurality of pixels may implement visible lights of various colors.

In an exemplary embodiment, the plurality of pixels may include a red pixel Pr that emits red visible light, a green pixel Pg that emits green visible light, and a blue pixel Pb that emits blue visible light.

Each of the plurality of pixels includes an OLED.

In an exemplary embodiment, each pixel includes an electronic device that is electrically connected to the OLED. The electronic device may include one or more thin film transistors (TFTs) and a storage capacitor. The electronic device may transfer various kinds of electrical signals, which are necessary for driving the OLED, to the OLED.

In FIG. 2, only the OLED and the TFT that drives the OLED are illustrated for each pixel. This is merely for convenience of a description, and the present exemplary embodiment is not limited thereto. Each pixel may further include a plurality of the TFTs, a storage capacitor, and various lines.

The TFT of FIG. 2 is of a top gate type, and sequentially includes an active layer 102, a gate electrode 104, a source electrode 106a, and a drain electrode 106b. In the present exemplary embodiment, the TFT having the top gate is disclosed. However, the present invention is not limited to the TFT disclosed in the drawing, and various types of TFTs may be applied. For example, a TFT having a bottom gate structure may also be applied to the organic light emitting display apparatus.

A buffer layer 101 may be formed on top of the first substrate 100, for providing smoothness and preventing the penetration of an impure element. The buffer layer 101 may be deposited by various deposition processes, such as a plasma enhanced chemical vapor deposition (PECVD) process, an atmospheric pressure CVD (APCVD), and a low pressure CVD (LPCVD) by using $SiO_2$ and/or $SiN_x$. The buffer layer 101 is optional and may not be formed, depending on the particular case.

The active layer 102 is formed in a region corresponding to each pixel on the buffer layer 101. An inorganic semiconductor, such as silicon or an oxide semiconductor, or an organic semiconductor may be formed over all of the first substrate 100 on the buffer layer 101, and then may be patterned to form the active layer 102.

In an exemplary embodiment, when the active layer 102 is formed of silicon, an amorphous silicon layer may be used.

In another exemplary embodiment, the active layer 102 may include a polycrystalline silicon layer that is formed by crystallizing amorphous silicon.

In another exemplary embodiment, the active layer 102 may include a drain region and a source region into which impurities are injected, and may include a channel region formed between the source region and the drain region.

A gate insulating layer 103, which insulates the active layer 102 from a gate electrode 104, is formed on the active layer 102. The gate insulating layer 103 may be formed of various insulating materials and, for example, may be formed of oxide or nitride.

The gate electrode 104 is formed in a certain region on the gate insulating layer 103. In an optional embodiment, the gate electrode 104 is connected to a gate line (not shown) through which an on/off signal for the TFT is applied.

An interlayer insulating layer 105 is formed on the gate electrode 104, and a source electrode 106a and a drain electrode 106b contact a certain region of the active layer 102 through a contact hole. For example, the source electrode 106a and the drain electrode 106b are formed to contact a source region and a drain region of the active layer 102. The TFT which is formed in this way is covered and protected by a passivation layer 107.

The passivation layer 107 may use an inorganic insulating layer and/or an organic insulating layer. The inorganic insulating layer may include $SiO_2$, $SiN_x$, $SiON$, $Al_2O_3$, $TiO_2$, $Ta_2O_5$, $HfO_2$, $ZrO_2$, BST, and PZT. The organic insulating layer may include a general-use polymer (polymethyl methacrylate (PMMA) and polystyrene (PS)), poly derivatives of a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. Also, the passivation layer 107 may be formed of a complex stacked body of an inorganic insulating and an organic insulating layer.

The OLED is included in an emission region on the passivation layer 107.

The OLED may include a pixel electrode 111 which is formed on the passivation layer 107, an opposite electrode 112 opposite thereto, and an intermediate layer having an organic emission layer disposed therebetween.

The organic light emitting display apparatus is divided into a bottom emission type, a top emission type, and a dual emission type depending on an emission direction. In the bottom emission type, the pixel electrode 111 is provided as a light transmitting electrode, and the opposite electrode 112 is provided as a reflective electrode. In the top emission type, the pixel electrode 111 is provided as a reflective electrode, and the opposite electrode 112 is provided as a semi-transmissive electrode. The present exemplary embodiment will be described based on the top emission type in which the OLED emits light toward the encapsulating member 210.

The pixel electrode 111 may include a reflective layer, which is formed of silver (Ag), magnesium (Mg), aluminum (Al), platinum (Pt), palladium (Pd), gold (Au), nickel (Ni), neodymium (Nd), iridium (Ir), chromium (Cr), and a compound thereof, and a light transmitting layer which is formed of indium tin oxide (ITO), indium zinc oxide (IZO), zinc oxide (ZnO), or indium oxide ($In_2O_3$). The pixel electrode 111 may be patterned and formed in an island shape corresponding to each pixel. Also, the pixel electrode 111 may be connected to an external terminal (not shown), and may act as an anode electrode.

A pixel defining layer 109, which covers an edge of the pixel electrode 111 and includes an opening which exposes a central portion of the pixel electrode 111, is disposed on the pixel electrode 111. An emission region is defined by forming an organic emission layer 113, which emits light, in a region limited by the opening. When the emission region is formed in the pixel defining layer 109 by the opening, a protrusion, which protrudes further than the emission region, is naturally formed between a plurality of the emission regions, and is a non-emission region because an organic emission layer is not formed.

The opposite electrode 112 may be provided as a transmissive electrode, and may be a semi-transmissive layer which has a low work function and is thinly formed of metal such as lithium (Li), calcium (Ca), LiF/Ca, LiF/Al, Al, Mg, and Ag. A transmissive conductive layer is formed of ITO, IZO, ZnO, or $In_2O_3$ on the metal semi-transmissive layer, and solves a problem of a high resistance caused by a thickness of a thin metal semi-transmissive layer. The opposite electrode 112 may be formed over the entire first substrate 100 in a form of a common electrode. Also, the opposite electrode 112 may be connected to an external terminal (not shown), and may act as a cathode electrode.

The pixel electrode 111 and the opposite electrode 112 may have opposite polarities.

An intermediate layer includes the organic emission layer 113 which emits light, and the organic emission layer 113 may use a low-molecular organic material or a polymer organic material.

In an exemplary embodiment, the intermediate layer may further include at least one or more selected from a hole transport layer (HTL), a hole injection layer (HIL), an electron transport layer (ETL), and an electron injection layer (EIL) along with the organic emission layer 113. In an exemplary embodiment, when only the hole transport layer is formed between the organic emission layer 113 and the pixel electrode 111, the polymer hole transport layer may be formed of poly-(2,4)-ethylene-dihydroxy thiophene (PEDOT) or polyaniline (PANI) on the pixel electrode 111 by an inkjet printing process or a spin coating process.

The OLED illustrated in FIG. 2 may emit white light according to the electrical driving of the pixel electrode 111 and the opposite electrode 112. A method which emits white light from the organic emission layer 113 may use a wave conversion (down conversion) method, which excites a phosphor into blue light or violet light and mixes various colors emitted from the phosphor to generate a wavelength spectroscopic spectrum of a broad and plentiful region, or a color mixing method that mixes two basic colors (blue or orange) or three basic colors (red, green, and blue) to emit white light. In the present invention, white light is realized by using the color mixing method.

However, the organic emission layer 113 is not limited to a case of emitting only white light, and may emit one selected from red light, green light, and blue light for each pixel.

In the organic light emitting display apparatus according to an exemplary embodiment of the present invention illustrated in FIG. 2, the encapsulating member 210 is formed on the first substrate 100 to cover the display unit 110. The encapsulating member 210 is formed of a plurality of insulating layers which are sequentially stacked, and in detail, the plurality of insulating layers have a structure in which the organic layer 202 and a plurality of inorganic layers 201 and 203 are alternately stacked.

The inorganic layers 201 and 203 may be formed of metal oxide, metal nitride, metal carbide, and a compound thereof, and for example, may be formed of aluminum oxide, silicon oxide, or silicon nitride. The inorganic layers 201 and 203 prevent external moisture and oxygen from penetrating into the OLED. The organic layer 202 may be formed of a polymer organic compound, and may include one selected from epoxy, acrylate, or urethane acrylate. The organic layer 202 mitigates an internal stress of each of the inorganic layers 201 and 203, supplements drawbacks of the inorganic layers 201 and 203, and smooths the inorganic layers 201 and 203.

The encapsulating member 210 is not limited to the structure of FIG. 2, and may include at least one sandwich structure in which at least one organic layer is inserted between at least two inorganic layers. As another example, the encapsulating member 210 may include at least one sandwich structure in which at least one inorganic layer is inserted between at least two organic layers. As another example, the encapsulating member 210 may include a sandwich structure in which at least one organic layer is inserted between at least two inorganic layers and a sandwich structure in which at least one inorganic layer is inserted between at least two organic layers. An uppermost layer of the encapsulating member 210 exposed to the outside may be formed of an inorganic layer so as to prevent penetration of moisture.

In this case, a first organic layer may be formed narrower in area than a second inorganic layer, and the second inorganic layer may be formed narrower in area than a third inorganic layer. As another example, the first organic layer may be formed to be completely covered by the second inorganic layer, and the second inorganic layer may also be formed to be completely covered by the third inorganic layer.

As described above, a black matrix 212 is formed on the second substrate 200. The black matrix 212 is formed to correspond to a non-emission region.

In an exemplary embodiment, the black matrix 212 may be formed to have an opening corresponding to an emission region. The black matrix 212 prevents visible lights of different colors, which are emitted from the respective pixels, from being abnormally mixed with each other or exerting an influence. Also, the black matrix 212 prevents elements of the TFT from being damaged by external light.

The black matrix 212 may be formed of various materials. In an exemplary embodiment, the black matrix 212 may be easily formed of chromium oxide ($CrO_x$) or a black organic material with which a black pigment is mixed. Also, as described below, the black matrix 212 blocks some of light emitted from a corresponding emission region so as to obtain an effect in which a viewing angle "θ" is changed according to an increase or a decrease in an interval between the OLED and the second substrate 200.

A method of manufacturing the black matrix 212 is changed depending on a material forming the black matrix 212, but when the black matrix 212 is formed of Cr or $CrO_x$ which is generally used, a single layer of Cr or $CrO_x$ is formed by a sputtering process or an E-beam deposition process. Also, two-layer layers or three-layer layers may be formed of Cr or $CrO_x$. A cross-sectional surface of each blocking element of the black matrix 212 may have a rectangular shape, or may have a trapezoid shape for increasing a side luminance ratio.

In an exemplary embodiment, as illustrated in FIG. 2, the organic light emitting display apparatus may include a color filter 211 in correspondence with a plurality of emission regions.

For example, a plurality of the color filters 211 may be formed to be respectively disposed in openings of the black matrix 212. The color filter 211 is disposed to fill an opening which corresponds to a corresponding emission region, between the blocking elements of the black matrix 212. In this case, a portion of the color filter 211 may overlap a portion of a corresponding blocking element of black matrix 212. However, the present exemplary embodiment is not limited to the structure, and the color filter 211 may be disposed so that a thickness of the color filter 211 is the same as that of each of the black matrix 212.

The color filter 211 may include a coloring material and an organic material in which the coloring material is dispersed. Here, the coloring material may be a pigment or a dye, and the organic material may be a general dispersant. The color filter 211 selectively transmits only light of a certain wavelength, such as red, green, or blue, in white light emitted from the OLED, and absorbs light of the other wavelength, thereby emitting one selected from red light, green light, and blue light in each pixel. As described above, a plurality of color filters 211R, 211G and 211B which respectively have red, green, and blue are disposed in correspondence with the respective emission regions, and thus, the plurality of emission regions emit red light, green light, and blue light, respectively.

Moreover, the present invention is not limited thereto, and when visible light having a certain color (for example, red visible light, green visible light, and blue visible light) is emitted from the OLED, the color filters 211R, 211G and 211B enhance a characteristic of the visible light.

A method of manufacturing the color filter 211 may use a pigment dispersion process, a printing process, an electrode-position process, a film transfer process, and/or a thermal transfer process.

Although not illustrated, a buffering layer (not shown) may be formed of $SiO_2$ or $SiN_x$ so as to enhance adhesiveness between the color filter 211 and the second substrate 200. A protective layer (not shown) may be formed on the color filter 211, the color filter 211 may be planarized, and the buffering layer may be formed.

Figure 3:
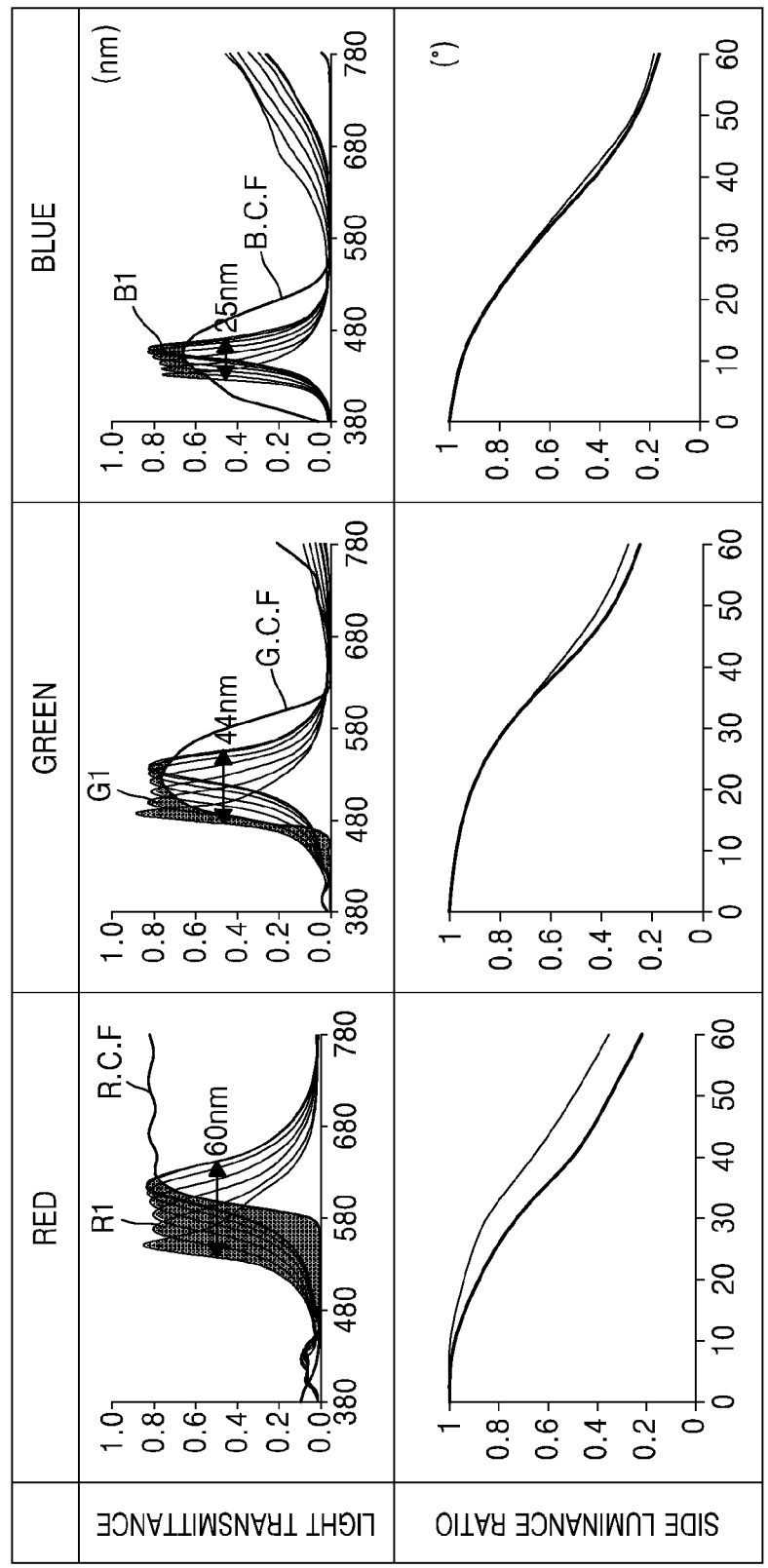
FIG. 3 is a graph showing a spectroscopic spectrum of an organic light emitting display apparatus, having a resonance structure, and a side luminance ratio change based on the spectroscopic spectrum.

FIG. 3 is a graph showing a spectroscopic spectrum of an organic light emitting display apparatus having a resonance structure, and a side luminance ratio change based on the spectroscopic spectrum.

Generally, the organic light emitting display apparatus may be used in various viewing angle modes depending on a use state. Referring to FIG. 2, a viewing angle "θ" of the OLED according to an exemplary embodiment may be variously changed from 0 degrees to 60 degrees when a user views the OLED from the front.

Optical resonance or a microcavity effect denotes a phenomenon in which, when an optical distance between two surfaces having reflectivity or semi-transmissivity for incident light satisfies an interference condition for light of a certain wavelength, a luminance or an intensity of the light of the certain wavelength increases. Referring to FIGS. 2 and 3, one or more of a plurality of the OLEDs may be provided in a resonance structure. The viewing angle "θ" of the OLED is changed from 0 degrees to 60 degrees, and thus, spectroscopic spectrums of red, green, and blue are changed. In a red wavelength, a viewing angle "θ" is changed from 0 degrees to 60 degrees, and thus, a peak of a wavelength is moved up to a maximum of 60 nm. In a green wavelength and a blue wavelength, a viewing angle "θ" is changed from 0 degrees to 60 degrees, and thus, a peak of a wavelength is moved up to a maximum of 44 nm and 25 nm. On the other hand, as described above, since a wavelength band which passes through the color filter 211 is specified, an amount of light passing through the color filter 211 may be changed according to a movement of spectroscopic spectrums of red, green, and blue, and thus, a side luminance ratio based on a viewing angle "θ" of finally output light may be changed.

In detail, in the red color filter 211a, since the viewing angle "θ" is changed from 0 degrees to 60 degrees, a peak of a red wavelength is moved up to a maximum of 60 nm, and thus, red light of a wavelength corresponding to a first region R1 cannot pass through a red color filter 211a. Therefore, a side luminance ratio of finally output red light is reduced. Referring to a graph associated with a side luminance ratio of red light in FIG. 3, it may be seen that as a viewing angle "θ" increases, a side luminance ratio of red light decreases.

In a green color filter 211b and a blue color filter 211c, since a viewing angle "θ" is changed from 0 degrees to 60 degrees, peaks of green and blue wavelengths are respectively moved up to a maximum of 44 nm and 25 nm, and thus, green light of a wavelength corresponding to a second region G1 cannot pass through the green color filter 211b, and blue light of a wavelength corresponding to a third region B1 cannot pass through the blue color filter 211c. Therefore, as a viewing angle "θ" increases, a side luminance ratio of each of finally output green light and blue light is reduced. Referring to a graph associated with a side luminance ratio of green and blue light in FIG. 3, it may be seen that as a viewing angle "θ" increases, the side luminance ratio of each of the green light and the blue light is far less reduced than the side luminance ratio of the red light. This is because an amount of light of the first region R1 which cannot pass through the red color filter 211a is greater than an amount of light of each of the second and third regions G1 and B1 which cannot pass through the green color filter 211b and the blue color filter 211c.

Figure 4:
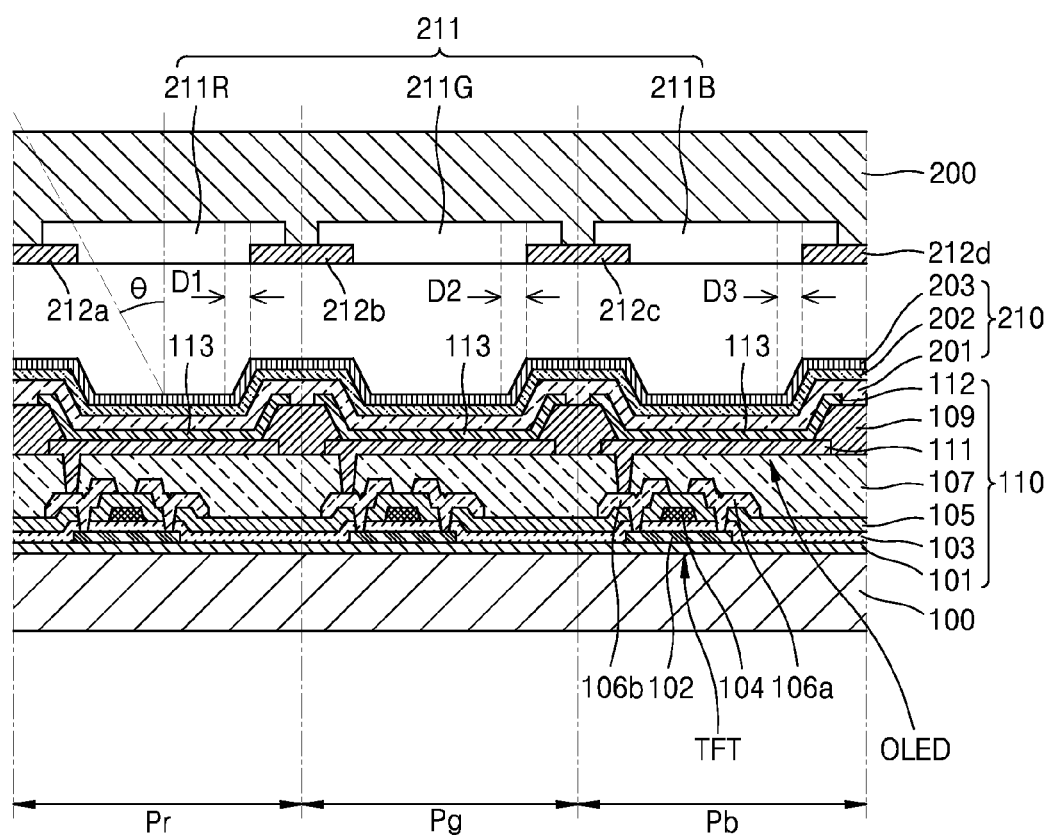
FIG. 4 is a cross-sectional view schematically illustrating an organic light emitting display apparatus according to an exemplary embodiment of the present invention.

FIG. 4 is a cross-sectional view schematically illustrating an organic light emitting display apparatus according to an embodiment of the present invention which adjusts an offset distance D between an edge of an emission region of an OLED and an edge of a black matrix.

In an exemplary embodiment, a color mixing method which mixes three basic colors (red, green, and blue) is used for emitting white light. Therefore, when side luminance ratios of respective wavelengths are reduced at different rates as a viewing angle "θ" increases, a ratio of mixed colors is changed, and thus, a shift of white light occurs. Referring to FIG. 4, the organic light emitting display apparatus according to an exemplary embodiment may adjust a first offset distance D1 between an edge of an emission region of red light and an edge of a black matrix blocking element 212b, a second offset distance D2 between an edge of an emission region of green light and an edge of a black matrix blocking element 212c, and a third offset distance D3 between an edge of an emission region of blue light and an edge of a black matrix blocking element 212d. However, the present exemplary embodiment is not limited thereto, and the organic light emitting display apparatus may additionally adjust an offset distance D between another edge of an emission region and another edge of a black matrix 212 blocking element.

The first to third offset distances D1 to D3 are adjusted in consideration of the side luminance ratio changes of respective wavelengths caused by a change in a viewing angle "θ", thereby preventing a shift of white light. In this case, the side luminance ratio changes of the respective wavelengths differ, and thus, the first to third offset distances D1 to D3 may be differently determined. However, since a side luminance ratio change caused by red light is relatively greater than a side luminance ratio change caused by green light and blue light, a degree of shift of white light is the most greatly determined by the first offset distance D1. For example, the first offset distance D1 may be determined greater than the second offset distance D2 or the third offset distance D3. As another example, one of the second and third offset distances D2 and D3 may be adjusted equally to the first offset distance D1, and the other may be determined less than the first offset distance D1.

Figure 5:
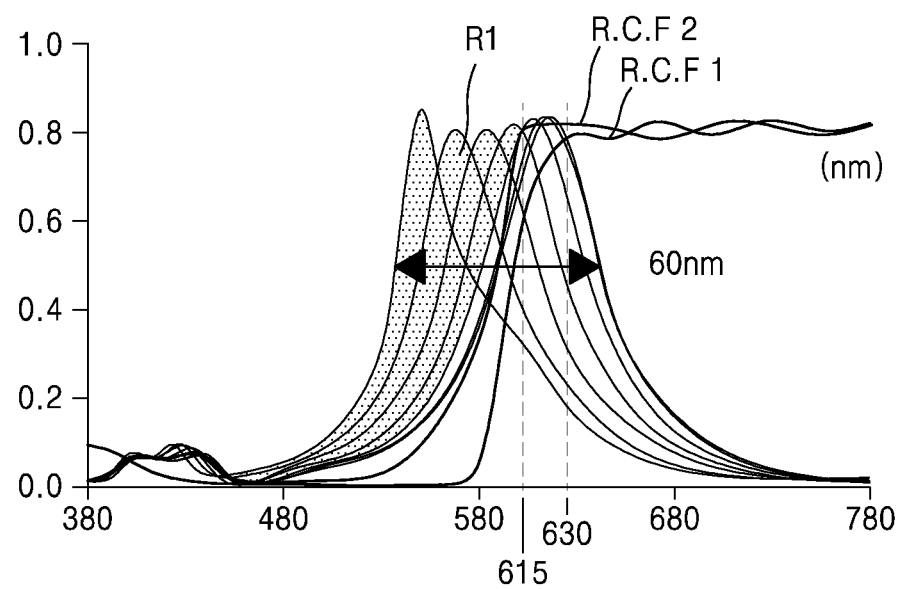
FIG. 5 is a graph showing a spectroscopic spectrum of a red color filter.

FIG. 5 is a graph showing a spectroscopic spectrum of a red color filter.

Referring to FIG. 5, as an inflection wavelength of a spectroscopic spectrum of the red color filter 211a is shortened from 630 nm(R.C.F1) to 615 nm(R.C.F2), the first region R1 of red light which cannot pass through the red color filter 211a is reduced, and thus, a reduction in a side luminance ratio of the red light decreases. Since the reduction in the side luminance ratio of the red light decreases, the number of cases of the offset distances D1 to D3 of red, green, and blue in which a shift of white light is minimized increases.

The following Table 1 shows that a difference value with a position of white light, which is generated when a viewing angle "θ" is 60 degrees, with respect to a position of white light (which is generated when the viewing angle "θ" is 0 degrees) is digitized, and shows experiment values of offset distances D1 to D3 in which a difference value is less than 0.015 that is a difference value which is generated when a polarizer is disposed in the organic light emitting display apparatus so as to prevent external light from being reflected. In this case, Δ u'v' denotes a change amount of new coordinates with respect to reference coordinates in two-dimensional coordinates.

Figure 6:
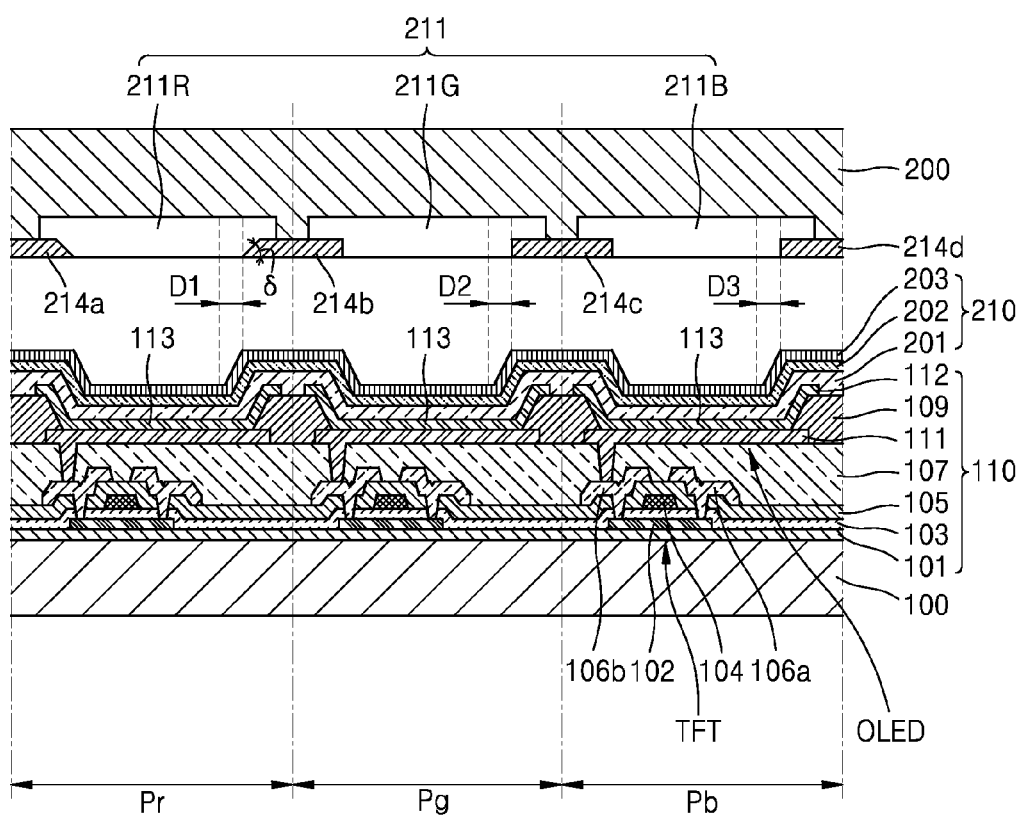
FIG. 6 is a cross-sectional view schematically illustrating an organic light emitting display apparatus according to another exemplary embodiment of the present invention.

FIG. 6 illustrates an example of an organic light emitting display apparatus in which a shape of a black matrix blocking element is changed.

A side luminance ratio based on a viewing angle "θ" may be adjusted by changing a shape of each of black matrix blocking elements 214a and 214b, in addition to an offset distance D. Referring to FIG. 6, each of the black matrix blocking elements 214a and 214b which are disposed at both ends of an emission region of red light is provided to have an inclined portion, and further increase an amount of red light based on the viewing angle "θ" than a case in which the black matrix blocking elements 214a and 214b which are disposed at the both ends of the emission region of the red light are vertically disposed. Therefore, a side luminance ratio of the red light is controlled even without adjusting a first offset distance D1, and thus, a shift of white light is prevented. In this case, the side luminance ratio of the red light is more precisely controlled by adjusting an angle "δ" of the included portion of each of the black matrix blocking elements 214a and 214b, and thus, a shift of white light is prevented.

However, the present invention is not limited thereto, and a shape of an end of each of the black matrix blocking elements 214a and 214b may be provided. Also, the side luminance ratio of the red light is controlled by adjusting the angle "δ" of the included portion of each of the black matrix blocking elements 214a and 214b and simultaneously adjusting first to third offset distances D1 to D3, and thus, a shift of white light can be prevented.

As described above, according to the one or more of the above exemplary embodiments of the present invention, the organic light emitting display apparatus prevents a white color shift phenomenon at various viewing angles, and thus, a certain image is secured regardless of a use environment of a user.

TABLE 1

| 615 nm | | 620 nm | | 625 nm | | 630 nm | | 635 nm | | 640 nm | |
| --- | --- | --- | --- | --- | --- | --- | --- | --- | --- | --- | --- |
| Offset Distance (R/G/B) μm | 60 Degrees Δu'v' | Offset Distance (R/G/B) μm | 60 Degrees Δu'v' | Offset Distance (R/G/B) μm | 60 Degrees Δu'v' | Offset Distance (R/G/B) μm | 60 Degrees Δu'v' | Offset Distance (R/G/B) μm | 60 Degrees Δu'v' | Offset Distance (R/G/B) μm | 60 Degrees Δu'v' |
| 2/1/0 | 0.0077 | 1/1/0 | 0.0019 | 2/1/0 | 0.004 | 2/1/0 | 0.00299 | 2/1/0 | 0.0044 | 4/0/0 | 0.012 |
| 2/2/0 | 0.0057 | 2/1/0 | 0.006 | 3/1/0 | 0.0094 | 3/1/0 | 0.00686 | 3/1/0 | 0.0044 | | |
| 2/2/1 | 0.0038 | 2/2/1 | 0.0012 | 3/2/1 | 0.004 | 4/1/0 | 0.01 | 4/1/0 | 0.0076 | | |
| 1/1/0 | 0.0023 | 3/2/1 | 0.0058 | 3/3/1 | 0.0037 | | | | | | |
| 3/2/1 | 0.0075 | 3/3/1 | 0.0046 | 4/2/1 | 0.0076 | | | | | | |
| 3/2/2 | 0.008 | 3/3/2 | 0.001 | 4/3/1 | 0.005 | | | | | | |
| 3/3/2 | 0.0023 | 4/2/1 | 0.0098 | 4/4/1 | 0.0075 | | | | | | |
| 4/3/1 | 0.0089 | 4/3/1 | 0.0072 | | | | | | | | |
| 4/3/2 | 0.0062 | 4/3/2 | 0.0045 | | | | | | | | |
| 4/4/1 | 0.0037 | 4/4/1 | 0.0085 | | | | | | | | |
| 4/4/2 | 0.0049 | 4/4/2 | 0.0034 | | | | | | | | |

Referring to FIG. Table 1, the number of cases of an optimal offset distance D in which a degree of shift of white light is minimized as a spectroscopic inflection wavelength of the red color filter 211a becomes shorter increases. When an inflection wavelength of a spectroscopic spectrum of the red color filter 211a exceeds 645 nm, a case in which a color filter is disposed is not efficient in comparison with a case in which the polarizer is disposed. However, since a reflection rate increases as an inflection wavelength of a color filter becomes shorter, offset distances D1 to D3 in which an inflection wavelength is large and a movement of white light is minimized may be determined.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display apparatus comprising:
   a first substrate;
   a second substrate opposing the first substrate;
   a display unit disposed at a surface facing the second substrate among surfaces of the first substrate, and comprising a plurality of emission regions in which a plurality of organic light emitting diodes (OLEDs) are respectively disposed, each emission region comprising a resonance structure comprising a reflective pixel electrode and a semi-transmissive opposite electrode having an optical distance therebetween configured to satisfy an interference condition for light of a selected wavelength to provide a microcavity effect;

a black matrix disposed at a surface facing the first substrate among surfaces of the second substrate, and comprising light blocking elements in a single plane overlapping a peripheral region of a corresponding emission region; and a plurality of color filters disposed adjacent to the light blocking elements of the black matrix in correspondence with the plurality of emission regions, wherein a single set offset distance between one end of an emission region and one end of the light blocking element of the black matrix adjacent to the one end of the emission region for all ends of the emission region is different for selected emission regions to reduce a shift of white light caused by a viewing angle.

2. The organic light emitting display apparatus of claim 1, wherein the display unit further comprises a pixel defining layer, and each of the plurality of emission regions is defined by the pixel defining layer.

3. The organic light emitting display apparatus of claim 1, wherein the viewing angle is in a range of 0 degrees to 60 degrees.

4. The organic light emitting display apparatus of claim 2, wherein the plurality of color filters comprise a red color filter, a green color filter, and a blue color filter, and are configured to generate the white light in a color mixing method.

5. The organic light emitting display apparatus of claim 4, wherein a first offset distance of a red emission region is greater than a second offset distance of a green emission region and a third offset distance of a blue emission region.

6. The organic light emitting display apparatus of claim 4, wherein one offset distance selected from one of a second offset distance of a green emission region and a third offset distance of a blue emission region is the same as a first offset distance of a red emission region, and the other offset difference is less than the first offset distance.

7. The organic light emitting display apparatus of claim 4, wherein an inflection wavelength of a spectroscopic spectrum of the red color filter is in a range of 615 nm to 640 nm.

8. The organic light emitting display apparatus of claim 4, wherein one or more of ends of the light blocking element of the black matrix disposed adjacent to both ends of a red emission region comprise an inclined portion.

9. The organic light emitting display apparatus of claim 7, wherein an offset distance of each of a red emission region, a green emission region, and a blue emission region is determined based on the inflection wavelength of the spectroscopic spectrum of the red color filter.

10. The organic light emitting display apparatus of claim 8, wherein the shift of the white light is adjusted based on an inclined angle of the inclined portion.

* * * * *